(12) United States Patent
Ariga et al.

(10) Patent No.: US 12,326,603 B2
(45) Date of Patent: Jun. 10, 2025

(54) OPTICAL MODULE USING A CAPACITOR TO SUPPRESS WARPAGE

(71) Applicant: FURUKAWA ELECTRIC CO., LTD., Tokyo (JP)

(72) Inventors: Maiko Ariga, Tokyo (JP); Yusuke Inaba, Tokyo (JP); Kazuki Yamaoka, Tokyo (JP); Junichi Hasegawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/391,589

(22) Filed: Aug. 2, 2021

(65) Prior Publication Data

US 2021/0364713 A1 Nov. 25, 2021

Related U.S. Application Data

(63) Continuation of application No. PCT/JP2020/004659, filed on Feb. 6, 2020.

(30) Foreign Application Priority Data

Feb. 8, 2019 (JP) ................................. 2019-021915

(51) Int. Cl.
*G02B 6/42* (2006.01)

(52) U.S. Cl.
CPC ......... *G02B 6/4267* (2013.01); *G02B 6/4215* (2013.01)

(58) Field of Classification Search
CPC .. G02B 6/4267; G02B 6/4215; G02B 6/1203; G02F 1/01; H01L 31/0232
See application file for complete search history.

(56) References Cited

U.S. PATENT DOCUMENTS 5,949,943 A * 9/1999 Watanabe ............... G02F 1/065
385/11
5,978,539 A * 11/1999 Davies ................. G02B 6/1203
385/129

(Continued)

FOREIGN PATENT DOCUMENTS

JP 2003-43272 A 2/2003
JP 2008-90129 A 4/2008

(Continued)

OTHER PUBLICATIONS

International Search Report issued Mar. 17, 2020 in PCT/JP2020/004659, filed on Feb. 6, 2020, 2 pages.

(Continued)

*Primary Examiner* — Andrew Jordan
(74) *Attorney, Agent, or Firm* — Oblon, McClelland, Maier & Neustadt, L.L.P.

(57) ABSTRACT

An optical module includes: a base having a predetermined product of a coefficient of linear expansion and a Young's modulus; a planar lightwave circuit element mounted on the base; and a warpage suppression component, which is mounted on a surface of the planar lightwave circuit element, the surface being on a side opposite to a side where the planar lightwave circuit element is mounted on the base, having a product of a coefficient of linear expansion and a Young's modulus that reduces warpage of the planar lightwave circuit element in accordance with warpage of the base depending on temperature change.

7 Claims, 4 Drawing Sheets

(56) References Cited

U.S. PATENT DOCUMENTS

| | | | | |
|---|---|---|---|---|
| 6,327,407 B1* | 12/2001 | Mitsuda | G02B 6/4243 | 385/91 |
| 6,377,723 B1* | 4/2002 | Saito | G02B 6/1203 | 385/15 |
| 6,377,743 B1* | 4/2002 | Ueda | G02B 6/3855 | 385/137 |
| 6,448,583 B1* | 9/2002 | Yoneda | G02B 6/4212 | 257/98 |
| 6,456,767 B2* | 9/2002 | Terashima | G02B 6/42 | 385/83 |
| 6,457,876 B1* | 10/2002 | Sawai | G02B 6/3825 | 385/92 |
| 6,477,308 B2* | 11/2002 | Hattori | G02B 6/122 | 385/141 |
| 6,603,916 B1* | 8/2003 | McGreer | G02B 6/12 | 385/132 |
| 6,720,582 B2* | 4/2004 | Miyokawa | G02B 6/4237 | 438/581 |
| 6,734,517 B2* | 5/2004 | Miyokawa | G02B 6/4202 | 257/434 |
| 6,782,028 B2* | 8/2004 | Tsukiji | H01S 5/146 | 372/75 |
| 6,865,308 B1* | 3/2005 | Conway | G02B 6/132 | 438/31 |
| 6,885,788 B2* | 4/2005 | Iwaki | H05K 1/0274 | 257/82 |
| 6,993,232 B2* | 1/2006 | Yoneda | G02B 6/1203 | 385/129 |
| 7,030,422 B2* | 4/2006 | Miyokawa | G02B 6/4208 | 257/796 |
| 7,046,868 B2* | 5/2006 | Terashima | G02B 6/4243 | 385/52 |
| 7,085,440 B2* | 8/2006 | Kimura | G02B 6/4218 | 385/11 |
| 7,684,133 B2* | 3/2010 | Tomita | G02B 6/30 | 359/821 |
| 7,771,108 B2* | 8/2010 | Iwasaki | G02B 6/0068 | 362/306 |
| 8,145,017 B2 | 3/2012 | Tanaka | | |
| 8,267,566 B2* | 9/2012 | Iwasaki | G02B 6/0091 | 362/628 |
| 8,437,228 B2* | 5/2013 | Matsushima | G11B 5/6088 | 369/13.13 |
| 8,607,440 B2* | 12/2013 | Fujita | H01C 7/008 | 29/593 |
| 8,705,907 B2* | 4/2014 | Wang | H01L 25/167 | 398/141 |
| 9,116,291 B2* | 8/2015 | Kasahara | G02B 6/12 | |
| 9,507,086 B2* | 11/2016 | Kobrinsky | G02B 6/30 | |
| 10,054,737 B2* | 8/2018 | Kobrinsky | H01L 23/49827 | |
| 10,541,234 B2* | 1/2020 | Furuyama | G02B 6/4214 | |
| 11,036,015 B2* | 6/2021 | Shikama | G02B 6/4219 | |
| 11,333,887 B2* | 5/2022 | Suzuki | G02B 6/34 | |
| 11,493,705 B2* | 11/2022 | Shikama | G02B 6/4219 | |
| 2001/0024553 A1* | 9/2001 | Nakanishi | G02B 6/4257 | 385/94 |
| 2001/0028768 A1* | 10/2001 | Terashima | G02B 6/4246 | 385/88 |
| 2001/0041039 A1* | 11/2001 | Hattori | G02B 6/132 | 385/129 |
| 2002/0005522 A1* | 1/2002 | Miyokawa | G02B 6/4237 | 257/79 |
| 2002/0009106 A1* | 1/2002 | Miyokawa | G02B 6/4237 | 372/36 |
| 2002/0009107 A1* | 1/2002 | Miyokawa | G02B 6/4237 | 372/50.23 |
| 2002/0009113 A1* | 1/2002 | Miyokawa | G02B 6/4237 | 372/50.1 |
| 2002/0097766 A1* | 7/2002 | Tsukiji | B82Y 20/00 | 372/50.22 |
| 2003/0007754 A1* | 1/2003 | Terashima | G02B 6/4246 | 385/88 |
| 2003/0021567 A1 | 1/2003 | Yoneda | | |
| 2003/0091263 A1* | 5/2003 | Yoneda | G02B 6/1203 | 385/14 |
| 2003/0142946 A1* | 7/2003 | Saito | G02B 6/30 | 385/137 |
| 2004/0001661 A1* | 1/2004 | Iwaki | G02B 6/43 | 385/14 |
| 2004/0028098 A1* | 2/2004 | Miyokawa | G02B 6/4248 | 372/36 |
| 2004/0033034 A1* | 2/2004 | Miyokawa | G02B 6/4202 | 385/93 |
| 2004/0240767 A1* | 12/2004 | Kimura | G02B 6/4218 | 385/11 |
| 2006/0078245 A1* | 4/2006 | Yoneda | G02B 6/1203 | 385/14 |
| 2008/0192373 A1 | 8/2008 | Tomita et al. | | |
| 2009/0103328 A1* | 4/2009 | Iwasaki | G02B 6/0088 | 362/617 |
| 2009/0122817 A1 | 5/2009 | Sato et al. | | |
| 2010/0080019 A1* | 4/2010 | Iwasaki | G02B 6/0091 | 362/628 |
| 2010/0119231 A1 | 5/2010 | Kim et al. | | |
| 2011/0026240 A1* | 2/2011 | Hayashi | G02F 1/133606 | 428/68 |
| 2011/0169601 A1* | 7/2011 | Fujita | C04B 35/42 | 338/22 R |
| 2011/0205865 A1* | 8/2011 | Matsushima | G11B 5/6088 | |
| 2012/0195332 A1 | 8/2012 | Yoffe et al. | | |
| 2012/0328237 A1* | 12/2012 | Ide | G02B 6/13 | 156/182 |
| 2013/0258505 A1* | 10/2013 | Yasui | G02B 6/4226 | 359/819 |
| 2014/0203175 A1* | 7/2014 | Kobrinsky | H04B 10/25 | 250/214.1 |
| 2015/0177457 A1* | 6/2015 | Kasahara | G02B 6/42 | 385/14 |
| 2015/0192736 A1* | 7/2015 | Kasahara | G02B 6/4239 | 385/14 |
| 2017/0131469 A1* | 5/2017 | Kobrinsky | G02B 6/12 | |
| 2017/0315316 A1* | 11/2017 | Tanaka | H05K 3/188 | |
| 2018/0082990 A1* | 3/2018 | Furuyama | H01L 31/0203 | |
| 2019/0331921 A1* | 10/2019 | Suzuki | G02B 27/02 | |
| 2020/0209477 A1* | 7/2020 | Shikama | G02B 6/3636 | |
| 2021/0231887 A1* | 7/2021 | Shikama | G02B 6/36 | |
| 2021/0364697 A1* | 11/2021 | Inaba | H01S 5/02325 | |
| 2021/0364713 A1* | 11/2021 | Ariga | G02B 6/1203 | |
| 2022/0390670 A1* | 12/2022 | Fujiwara | G02B 6/125 | |

FOREIGN PATENT DOCUMENTS

| | | |
|---|---|---|
| JP | 2008-197500 A | 8/2008 |
| JP | 2010-92904 A | 4/2010 |
| JP | 2010-512016 A | 4/2010 |
| JP | 2013-205494 A | 10/2013 |
| JP | 5786320 B2 * | 9/2015 |
| WO | WO 2007/029647 A1 | 3/2007 |

OTHER PUBLICATIONS

Chinese Office Action issued Oct. 14, 2023 in Chinese Application 202080012639.5, (with unedited computer-generated English translation), 15 pages.

* cited by examiner

OPTICAL MODULE USING A CAPACITOR TO SUPPRESS WARPAGE

CROSS-REFERENCE TO RELATED APPLICATION(S)

This application is a continuation of International Application No. PCT/JP2020/004659, filed on Feb. 6, 2020 which claims the benefit of priority of the prior Japanese Patent Application No. 2019-021915, filed on Feb. 8, 2019, the entire contents of which are incorporated herein by reference.

BACKGROUND

The present disclosure relates to an optical module.

In optical modules used for optical communication, planar lightwave circuits (PLCs) are sometimes used as optical branching waveguides and wavelength filters, for example (Japanese Laid-open Patent Publication Nos. 2013-205494 and 2010-092904).

SUMMARY

There is a need for providing an optical module in which change in optical characteristics in an PLC element in accordance with temperature change is suppressed.

According to an embodiment, an optical module includes: a base having a predetermined product of a coefficient of linear expansion and a Young's modulus; a planar lightwave circuit element mounted on the base; and a warpage suppression component, which is mounted on a surface of the planar lightwave circuit element, the surface being on a side opposite to a side where the planar lightwave circuit element is mounted on the base, having a product of a coefficient of linear expansion and a Young's modulus that reduces warpage of the planar lightwave circuit element in accordance with warpage of the base depending on temperature change.

DETAILED DESCRIPTION

Figure 1:
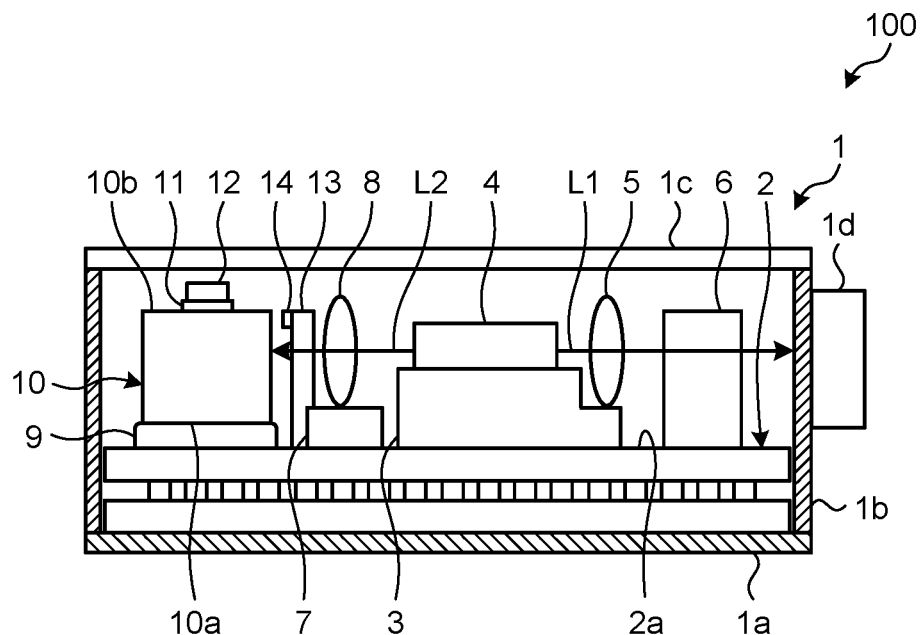
FIG. 1 is a schematic partial cutout side diagram of an optical module according to an embodiment.

In the related art, for example, in an optical module that uses a wavelength locker configured by a PLC element, when the PLC element is mounted on a base such as a ceramic substrate and joined and fixed, warpage stress occurs in the base such that the base becomes convex or concave if the base is heated or cooled due to change in environmental temperature or temperature adjustment. In this case, a waveguide in the PLC element that has received the stress is deformed or distortion occurs in the waveguide, causing a problem in that optical characteristics of the PLC element change.

Referring to the accompanying drawings, an embodiment of the present disclosure is described in detail below. Note that the present disclosure is not limited by the embodiment described below. In the drawings, the same or corresponding elements are denoted by the same reference symbols as appropriate. It should be noted that the drawings are schematic and the dimensional relations of the elements and the ratios of the elements are different from the actual ones. Parts with different dimensional relations and different ratios are included in some figures.

Embodiment

FIG. 1 is a schematic partial cutout side diagram of an optical module according to an embodiment. This optical module 100 includes a casing 1. The casing 1 includes a bottom plate portion 1a, a side wall portion 1b, a top lid portion 1c, and a light output portion 1d. The bottom plate portion 1a is a plate-shaped member. The side wall portion 1b is a frame plate-shaped member having four surfaces, and each surface is substantially orthogonal to the bottom plate portion 1a. The top lid portion 1c is a plate-shaped member disposed so as to be opposed to the bottom plate portion 1a. The light output portion 1d is a circular tubular member, and is provided to one surface of the side wall portion 1b. The side wall portion 1b is provided with a translucent window, and light can be transmitted from the inside of the casing 1 through the window and the light output portion 1d.

The bottom plate portion 1a is made of material having high thermal conductivity, such as copper tungsten (CuW), copper molybdenum (CuMo), and alumina ($Al_2O_3$). The side wall portion 1b, the top lid portion 1c, and the light output portion 1d are made of material having a low coefficient of thermal expansion, such as a Fe—Ni—Co alloy, alumina, aluminum nitride, and silicon nitride.

The components are housed inside the optical module 100: a thermoelectric cooling element (TEC) 2; a carrier 3; a semiconductor laser element 4; a lens 5; an optical isolator 6; a lens holder 7; a lens 8; a PLC element 10; a thermistor 12; a light receiving element holder 13; and a light receiving element unit 14.

In the optical module 100, these components are mounted inside the casing 1, and the top lid portion 1c is attached such that the optical module 100 is hermetically sealed.

The optical module 100 is configured as a semiconductor laser module. The configurations and functions of the components are described below.

The thermoelectric cooling element 2 is fixed to the bottom plate portion 1a. The thermoelectric cooling element 2 is supplied with power from the outside through a lead (not shown), and absorbs or generates heat depending on a flowing direction of current. In the present embodiment, the thermoelectric cooling element 2 is a publicly known Peltier module, and has a configuration in which a semiconductor element is disposed between two insulating substrates. Of the two substrates, a substrate on the top lid portion 1c side is referred to as "substrate 2a". The substrate 2a as a base has a predetermined product of a coefficient of linear expansion and a Young's modulus. Note that the two substrates include one of aluminum nitride, alumina, and silicon nitride ($Si_3N_4$), which are ceramics, for example. The two substrates may be aluminum nitride substrates, alumina substrates, or silicon nitride substrates.

The carrier 3, the semiconductor laser element 4, the lens 5, the optical isolator 6, the lens holder 7, the lens 8, the PLC element 10, the thermistor 12, the light receiving element holder 13, and the light receiving element unit 14 are mounted on the substrate 2a (base) in the thermoelectric cooling element 2. These components are controlled to have desired temperatures by causing current to flow through the thermoelectric cooling element 2.

The semiconductor laser element 4 is mounted on the carrier 3, and is, for example, a wavelength-tunable laser element. The carrier 3 is also called "sub-mount", which is made of insulating material with high thermal conductivity and efficiently transports heat generated by the semiconductor laser element 4 to the thermoelectric cooling element 2.

The semiconductor laser element 4 is supplied with power from the outside through a lead (not shown), and outputs a laser light beam L1 to the lens 5 side. The wavelength of the laser light beam L1 is, for example, 900 nm or more and 1,650 nm or less, which is suitable as a wavelength for optical communication.

The lens 5 is mounted on the carrier 3. The lens 5 inputs the laser light beam L1, and collimates and outputs the laser light beam L1.

The optical isolator 6 receives the collimated laser light beam L1, and transmits the laser light beam L1 therethrough, so as to output the laser light beam L1 to the light output portion 1d side. The optical isolator 6 blocks light that has traveled from the light output portion 1d side. In this manner, the optical isolator 6 prevents reflected light from being input to the semiconductor laser element 4 from the outside.

The semiconductor laser element 4 outputs a laser light beam L2 having relatively weak power from an edge (rear edge) on the opposite side of an edge (output edge) that is opposed to the lens 5 and outputs the laser light beam L1. The lens 8 is mounted on the lens holder 7, and condenses and outputs the laser light beam L2 to the PLC element 10.

Figure 2:
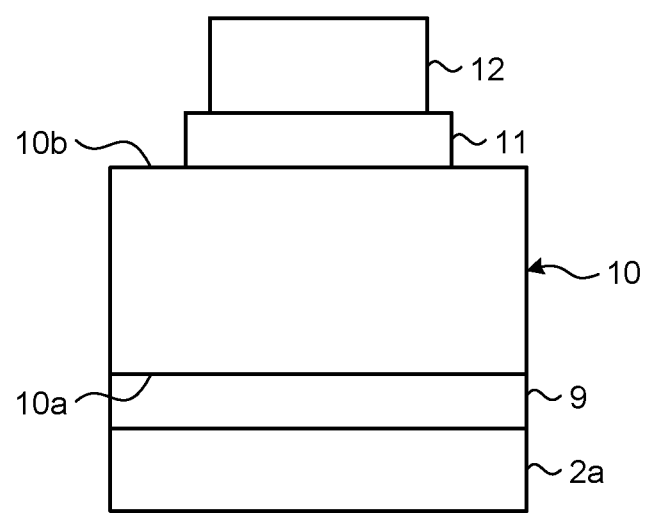
FIG. 2 is a schematic diagram for describing a mounted state of a PLC element and a warpage suppression component.

As illustrated in FIG. 1 and FIG. 2, the PLC element 10 as a planar lightwave circuit element is mounted on the substrate 2a on a mounting surface 10a, which is one principal surface, and is fixed to the substrate 2a by a joining agent 9. The PLC element 10 includes two ring filters the transmission characteristics of which periodically change depending on wavelengths. The PLC element 10 divides the input the laser light beam L2 into three light beams. The PLC element 10 outputs one of the divided light beams, and causes the other two light beams to transmit through the two ring filters to output. For example, the PLC element 10 contains silicon or silica-based glass as a constituent material. The PLC element 10 may be formed from a silicon waveguide or from a waveguide made of silica-based glass. For example, the joining agent 9 is an epoxy resin, an acrylic resin, a rubber adhesive, or a silicone resin adhesive.

The light receiving element unit 14 is mounted on the light receiving element holder 13, and includes three light receiving elements. The three light receiving elements receive three laser light beams output from the PLC element 10. Current signals output from the three light receiving elements are output to an external controller, and used for wavelength control of the laser light beam L1 similarly to the known art. In other words, the PLC element 10 constitutes a wavelength locker together with the three light receiving elements.

As illustrated in FIGS. 1 and 2, the thermistor 12 as a warpage suppression component is mounted on a surface 10b of the PLC element 10 on the opposite side of the mounting surface 10a for the substrate 2a, and is fixed to the PLC element 10 by a joining agent 11. The joining agent 11 is solder containing AuSn, SnAgCu, SnAgInBi, or SnBi, for example. The thermistor 12 contains metal elements as constituent materials, and is made of MnNiCo oxide, for example. The thermistor 12 is provided for temperature detection of the PLC element 10. When the joining agent 11 is solder, it is preferred that the surface 10b be metalized.

In the substrate 2a, warpage occurs in accordance with change in environmental temperature and temperature adjustment by the thermoelectric cooling element 2. When the PLC element 10 warps due to the warpage, optical characteristics of the PLC element 10 change. However, in the optical module 100, the thermistor 12 has a product of the coefficient of linear expansion and the Young's modulus that reduces the warpage in the PLC element 10. Specifically, when stress to warp the substrate 2a occurs in the substrate 2a, stress to warp the thermistor 12 also occurs in the thermistor 12. As a result, force of the substrate 2a to warp the PLC element 10 and force of the thermistor 12 to warp the PLC element 10 are applied to the PLC element 10 so as to cancel each other. As a result, the warpage caused in the PLC element 10 is reduced to suppress the change in optical characteristics.

The product of the coefficient of linear expansion and the Young's modulus of the substrate 2a indicates the magnitude of warpage stress caused in the substrate 2a, and the product of the coefficient of linear expansion and the Young's modulus of the thermistor 12 indicates the magnitude of warpage stress caused in the thermistor 12. Thus, in order to effectively reduce warpage caused in the PLC element 10, the product of the coefficient of linear expansion and the Young's modulus of the thermistor 12 is preferably 0.6 times or more and 1.5 times or less the product of the coefficient of linear expansion and the Young's modulus of the substrate 2a, more preferably 0.9 times or more and 1.1 times or less, still more preferably approximately 1 time.

Specific examples of optical characteristics of the PLC element 10 include waveguide loss and transmission wavelength spectrum of a ring filter. When the change in optical characteristics is suppressed, temperature dependency of accuracy of wavelength monitoring of the laser light beam L1 by the wavelength locker is suppressed.

Specific examples are described below with particular constituent materials in the configuration in FIG. 2.

The substrate 2a is an aluminum nitride substrate, and has a coefficient of linear expansion of $4.6 \times 10^{-6}/°$ C. and a Young's modulus of 320 GPa. In this case, the product of the coefficient of linear expansion and the Young's modulus (hereinafter sometimes referred to simply as "product") is $1,472 \times 10^{-6}$ GPa, and stress (thermal stress) caused when a temperature change $\Delta T$ is $40°$ C. is 58.88 MPa.

The joining agent 9 is an epoxy resin, and has a coefficient of linear expansion of $380 \times 10^{-6}/°$ C. and a Young's modulus of 0.65 GPa. In this case, the product is $247 \times 10^{-6}$ GPa, and stress caused when the temperature change $\Delta T$ is $40°$ C. is 9.88 MPa.

The PLC element 10 is made of silicon, and has a coefficient of linear expansion of $2.6 \times 10^{-6}/°$ C. and a Young's modulus of 185 GPa. In this case, the product is $481 \times 10^{-6}$ GPa, and stress caused when the temperature change $\Delta T$ is 40° C. is 19.24 MPa.

The joining agent 11 is solder with Au of 80% and Sn of 20%, and has a coefficient of linear expansion of $17.5 \times 10^{-6}$/° C. and a Young's modulus of 60 GPa. In this case, the product is $1,050 \times 10^{-6}$ GPa, and stress caused when the temperature change $\Delta T$ is 40° C. is 42 MPa.

The thermistor 12 is made of MnNiCo oxide, and has a coefficient of linear expansion of $9 \times 10^{-6}$/° C. and a Young's modulus of 150 GPa. In this case, the product is $1,350 \times 10^{-6}$ and stress caused when the temperature change $\Delta T$ is 40° C. is 54 MPa.

Regarding thermal stress, it is considered that contribution is large from elements having the largest thermal stress on both sides of the PLC element 10. The elements having the largest thermal stress are the substrate 2a on the mounting surface 10a side of the PLC element 10 and the thermistor 12 on the surface 10b side. The product in the substrate 2a is 58.88 MPa, and the product in the thermistor 12 is 54 MPa. In this case, the product in the thermistor 12 is approximately 0.92 times the product in the substrate 2a, which is preferred in terms of the suppression of change in optical characteristics of the PLC element 10.

As described above, in the optical module 100 according to the embodiment, the change in optical characteristics of the PLC element 10 in accordance with temperature change is suppressed.

Modification

Figure 3:
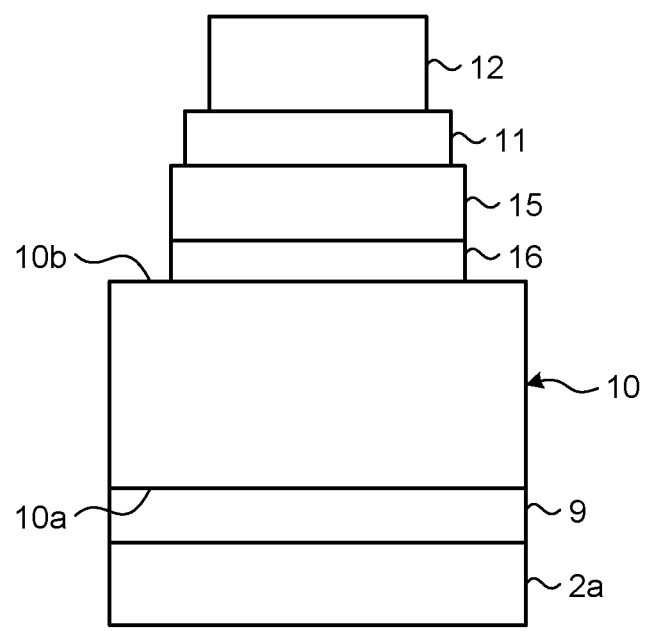
FIG. 3 is a schematic diagram for describing a modification of the mounted state of the PLC element and the warpage suppression component.

FIG. 3 is a schematic diagram for describing a modification of the first embodiment. In the configuration illustrated in FIG. 3, a substrate 15 is interposed between the PLC element 10 and the thermistor 12 in the configuration illustrated in FIG. 2. The substrate 15 is fixed to the PLC element 10 by a joining agent 16. The thermistor 12 is fixed to the substrate 15 by a joining agent 11. Similarly to the substrate 2a, the substrate 15 contains one of aluminum nitride, alumina, and silicon nitride, which are ceramics, for example, and may be an aluminum nitride substrate, an alumina substrate, or a silicon nitride substrate. Similarly to the joining agent 9, the joining agent 16 is, for example, an epoxy resin, an acrylic resin, a rubber adhesive, or a silicone resin adhesive.

In the present modification, the products of the coefficient of linear expansion and the Young's modulus are set such that at least one of the thermistor 12 and the substrate 15 functions as a warpage suppression component. In this manner, the change in optical characteristics of the PLC element 10 in accordance with temperature change is suppressed.

In the present modification, the surface 10b of the PLC element 10 is not necessarily required to be metalized.

Mounting Position

FIG. 4 are schematic diagrams for describing the mounting position of the thermistor. FIG. 4A, FIG. 4B, FIG. 4C, and FIG. 4D are each a diagram of the PLC element 10 as seen from the surface 10b side. The PLC element 10 has ring waveguides 10c and 10d and arm waveguides 10e and 10f as components of two ring filters. The ring waveguide 10c is optically coupled to the arm waveguide 10e, and the ring waveguide 10d is optically coupled to the arm waveguide 10f.

Figure 4A:
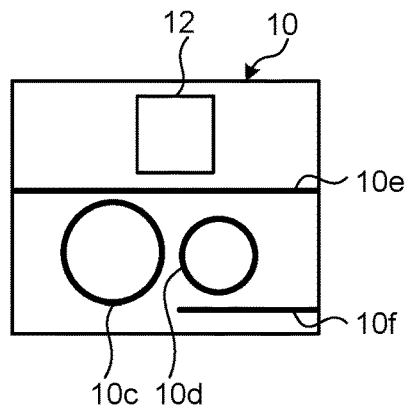
FIG. 4A is a schematic diagram for describing a mounting position of a thermistor.
Figure 4B:
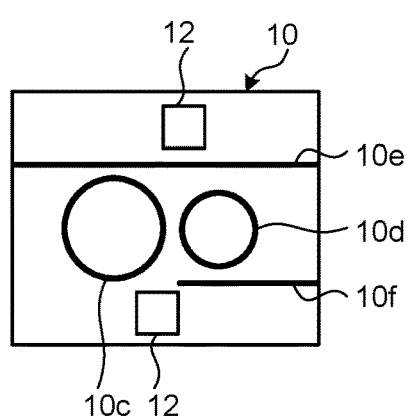
FIG. 4B is a schematic diagram for describing mounting positions of thermistors.
Figure 4C:
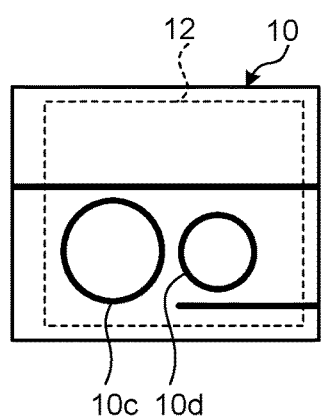
FIG. 4C is a schematic diagram for describing a mounting position of a thermistor.
Figure 4D:
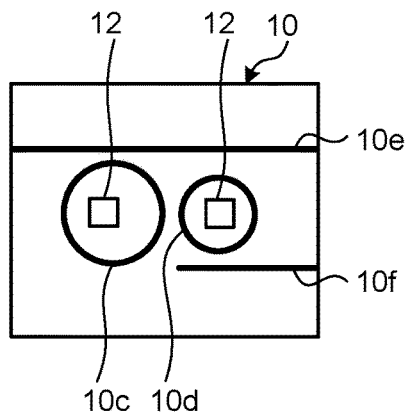
FIG. 4D is a schematic diagram for describing mounting positions of thermistors.

As illustrated in FIG. 4A, the thermistor 12 may be mounted so as not to overlap with the ring waveguides 10c and 10d and the arm waveguides 10e and 10f. As illustrated in FIG. 4B, two thermistors 12 may be mounted. As illustrated in FIG. 4C, the thermistor 12 may be mounted so as to overlap with a part of the ring waveguides 10c and 10d and the arm waveguides 10e and 10f. As illustrated in FIG. 4D, the thermistors 12 may be mounted in rings of the ring waveguides 10c and 10d.

Note that, in the above-mentioned embodiment, the PLC element includes a ring filter, but the PLC element is not limited thereto. For example, the PLC element may include a Mach-Zehnder interferometer (MZI).

Figure 5A:
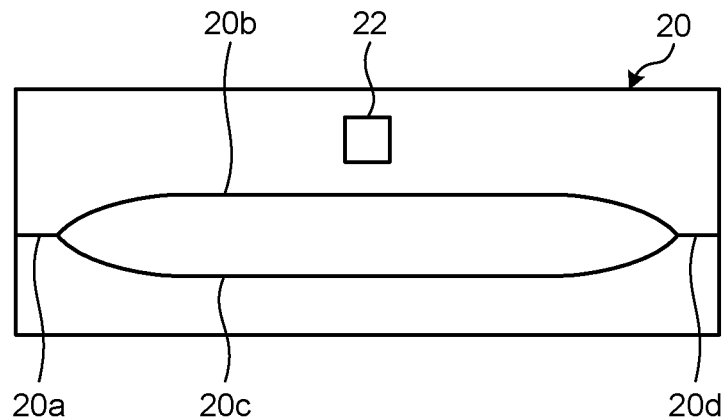
FIG. 5A is a schematic diagram for describing a mounting position of a thermistor in a PLC element including a Mach-Zehnder interferometer.
Figure 5B:
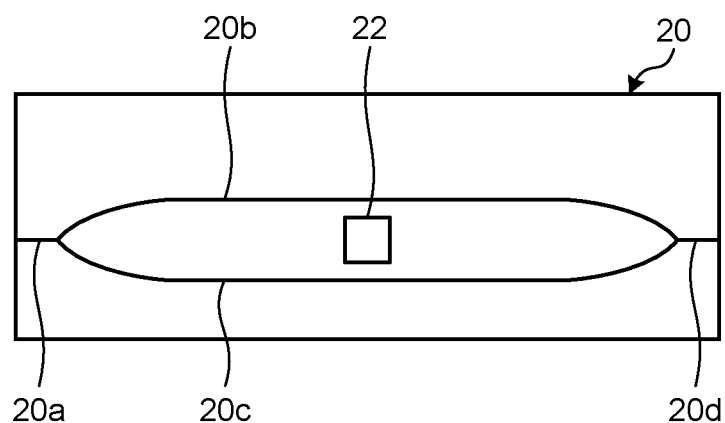
FIG. 5B is a schematic diagram for describing a mounting position of a thermistor in a PLC element including a Mach-Zehnder interferometer.
Figure 5C:
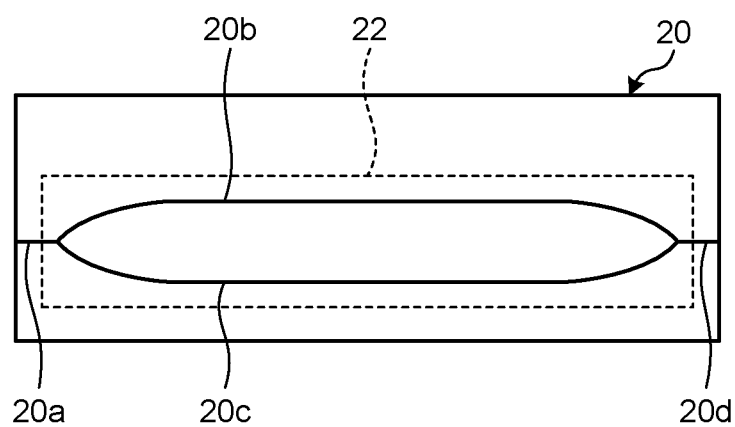
FIG. 5C is a schematic diagram for describing a mounting position of a thermistor in a PLC element including a Mach-Zehnder interferometer.

FIG. 5A, FIG. 5B, and FIG. 5C are each a schematic diagram for describing a mounting position of a thermistor in a PLC element including a Mach-Zehnder interferometer. A PLC element 20 includes a Mach-Zehnder interferometer having an input waveguide 20a, arm waveguides 20b and 20c, and an output waveguide 20d. Such a PLC element 20 constitutes an optical modulator. The PLC element 20 is mounted on an optical component mounting base, which is a base of an optical module configured as an optical modulator (optical modulator module), and, for example, fixed by an epoxy resin, an acrylic resin, a rubber adhesive, or a silicone resin adhesive. The optical component mounting base includes, for example, one of aluminum nitride, alumina, and silicon nitride, which is ceramics, and, for example, may be an aluminum nitride substrate, an alumina substrate, or a silicon nitride substrate.

A thermistor 22 mounted on the PLC element 20 and fixed by a joining agent such as solder is used for temperature detection of the PLC element 20, and functions as a warpage suppression component. In this manner, change in optical characteristics of the PLC element 20 in accordance with temperature change is suppressed. As illustrated in FIG. 5A, the thermistor 22 may be mounted so as not to overlap with the input waveguide 20a, the arm waveguides 20b and 20c, and the output waveguide 20d. As illustrated in FIG. 5B, the thermistor 22 may be mounted in a region between the arm waveguides 20b and 20c. As illustrated in FIG. 5C, the thermistor 22 may be mounted so as to cover a part of the arm waveguides 20b and 20c, the input waveguide 20a, and the output waveguide 20d.

Note that the warpage suppression component is not limited to a thermistor or a substrate, and, for example, may be a capacitor or a resistor. Particularly in an optical module configured as an optical modulator, a capacitor is used, and hence the capacitor can be mounted on the PLC element and used as a warpage suppression component. Accordingly, the substrate 2a and the warpage suppression component are made from different materials.

In the above-mentioned embodiment, the optical module is configured as a semiconductor laser module or an optical modulator module, but the optical module is not limited thereto. For example, the optical module may be configured as an optical receiver module including an optical receiver. In this case, for example, the PLC element is mounted so as to constitute a coherent mixer. The semiconductor laser module may further include an optical amplifier, in particular, a semiconductor optical amplifier. In this manner, a semiconductor laser module with higher output can be implemented. Alternatively, the optical module may be configured as an integrated coherent-transmitter receiver optical sub-assembly (IC-TROSA) in which all of an optical transmitter, an optical receiver, and an optical modulator are integrated.

According to an embodiment, an effect can be obtained in which change in optical characteristics in an PLC element in accordance with temperature change is suppressed.

The optical module according to the present disclosure can be preferably used, for example, in an optical communication field.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module, comprising:
a base having a predetermined product of a coefficient of linear expansion and a Young's modulus, wherein the base includes a substrate made of ceramics and having a side with a certain size;
a planar lightwave circuit element including silicon or silica-based glass as a constituent material and having a first side with a first size and a second side opposite to the first side and with a second size same as the certain size of the substrate, the planar lightwave circuit element being mounted on the base by an entire surface of the second side being joined with the side having the certain size of the substrate in the base; and
a warpage suppression component having a third size smaller than the first size, including a metal element as a constituent material, being mounted on a surface of the first side of the planar lightwave circuit element so as not to overlap with a waveguide included in the planar lightwave circuit element, and having a product of a coefficient of linear expansion and a Young's modulus that reduces warpage of the planar lightwave circuit element in accordance with warpage of the base depending on temperature change, wherein the product of the coefficient of linear expansion and the Young's modulus of the warpage suppression component is 0.6 times or more, and 1.5 times or less, than the predetermined product of the coefficient of linear expansion and Young's modulus of the base, wherein the warpage suppression component is a capacitor, and the optical module is configured as an optical modulator.

2. The optical module according to claim 1, wherein the substrate comprises at least one of aluminum nitride, alumina, and silicon nitride.

3. The optical module according to claim 1, wherein the base is an insulating substrate in an optical component mounting base or a Peltier module.

4. The optical module according to claim 1, wherein the warpage suppression component is joined to the planar lightwave circuit element with solder containing AuSn, SnAgCu, SnAgInBi, or SnBi.

5. The optical module according to claim 1, wherein the planar lightwave circuit element is bonded to the base with an epoxy resin, an acrylic resin, a rubber adhesive, or a silicone resin adhesive.

6. The optical module according to claim 1, wherein the substrate and the warpage suppression component are made from different materials.

7. The optical module according to claim 1, wherein:
the substrate is made from at least one of aluminum nitride, alumina, and silicon nitride, and
the warpage suppression component is made from MnNiCo oxide.

* * * * *